US006972636B2

(12) United States Patent
Murata

(10) Patent No.: US 6,972,636 B2
(45) Date of Patent: Dec. 6, 2005

(54) METHOD OF MANUFACTURING A HIGH-FREQUENCY SWITCH, A HIGH-FREQUENCY SWITCH AND AN ELECTRONIC APPARATUS

(75) Inventor: Akihiro Murata, Yamanashi-ken (JP)

(73) Assignee: Seiko Epson Corporation, (JP)

( * ) Notice: Subject to any disclaimer, the term of this patent is extended or adjusted under 35 U.S.C. 154(b) by 50 days.

(21) Appl. No.: 10/436,373

(22) Filed: May 12, 2003

(65) Prior Publication Data

US 2004/0041670 A1 Mar. 4, 2004

(30) Foreign Application Priority Data

May 20, 2002 (JP) ............................ 2002-145156

(51) Int. Cl.[7] .......................... H03H 7/12; H01P 1/203
(52) U.S. Cl. ...................... 333/99 S; 333/205; 505/210
(58) Field of Search ........................... 333/81 R, 81 A, 333/262, 99 S, 205, 235; 385/18, 16; 505/210, 505/235

(56) References Cited

U.S. PATENT DOCUMENTS

| | | | | |
|---|---|---|---|---|
| 5,770,546 | A * | 6/1998 | Grothe et al. | 505/210 |
| 5,949,311 | A * | 9/1999 | Weiss et al. | 333/202 |
| 6,049,726 | A * | 4/2000 | Gruenwald et al. | 505/210 |
| 6,208,222 | B1 * | 3/2001 | Sinsky | 333/161 |
| 6,275,320 | B1 * | 8/2001 | Dhuler et al. | 359/237 |
| 6,516,208 | B1 * | 2/2003 | Eden | 505/210 |
| 6,535,663 | B1 * | 3/2003 | Chertkow | 385/18 |
| 6,658,178 | B2 * | 12/2003 | Kasuga et al. | 385/19 |
| 6,737,938 | B2 * | 5/2004 | Kitamori et al. | 333/161 |
| 6,778,042 | B2 * | 8/2004 | Terashima et al. | 333/205 |

FOREIGN PATENT DOCUMENTS

| | | |
|---|---|---|
| DE | 19621335 | * 10/2001 |
| EP | 1 083 672 | 3/2000 |
| JP | 08-204406 | 8/1996 |
| JP | WO00/55983 | 3/1999 |

OTHER PUBLICATIONS

Mizuno, T of MEMS Application System in Microwave Band, Design Wave Magazine (Nov. 2002) and English translation thereof.

* cited by examiner

*Primary Examiner*—Dinh T. Le
(74) *Attorney, Agent, or Firm*—Harness, Dickey & Pierce, P.L.C.

(57) ABSTRACT

A BPF 20, which is a filter circuit, is formed by arranging a plurality of wiring patterns 21*a*, 21*b* and 22*a* to 22*c* on a substrate 10. Also, a freely movable impedance control rod 26 is formed so as to interfere with characteristics of the wiring patterns 21*a*, 21*b* and 22*a* to 22*c* of the BPF 20 without touching them. Interfering with the characteristics means cutting the passage of the frequency at the BPF 20, so that switching depends on whether the frequency is passed or cut.

10 Claims, 16 Drawing Sheets

(a)

(b)

METHOD OF MANUFACTURING A HIGH-FREQUENCY SWITCH, A HIGH-FREQUENCY SWITCH AND AN ELECTRONIC APPARATUS

BACKGROUND

1. Field of the Invention

The present invention relates to a method of manufacturing a high-frequency switch, a high-frequency switch and an electronic apparatus for switching in a non-contact condition.

2. Related Art

A high-frequency switch turns on and off an input high-frequency signal with high speed based on an external control signal and is often installed in cellular phones and optical communication apparatuses.

FIG. 17 shows one example of such a high frequency switch. The high-frequency switch shown in FIG. 17 employs Micro Electrical Mechanical System (MEMS) technology and comprises a drive electrode 2, a contact point 3 and a supporting portion 4 on a substrate 1. The supporting portion 4 supports a drive electrode 6 through a return spring 5. A contact point 8 is connected to the drive electrode 6 through a contact spring 7. When the voltage between the drive electrodes 2 and 6 is 0V, the contact points 3 and 8 are separated from each other as shown in FIG. 17(*a*). When 24V is applied between the drive electrodes 2 and 6, for example, the contact points 3 and 8 come into contact as shown in FIG. 17(*b*), and then the drive electrodes 2 and 6 also come into contact as shown in FIG. 17(*c*). When the voltage is 0V between the drive electrodes 2 and 6, operation of the return spring 5 and the contact spring 7 affect the drive electrodes 2 and 6 and also the contact points 3 and 8 to separate them from each other, respectively.

The above conventional high-frequency switch is a mechanical switch, which operates on/off switching depending on whether the contact points 3 and 8 are in contact or non-contact. Therefore, it is predicted that the reliability declines as the contact points 3 and 8 deteriorate. Moreover, since the return spring 5 and the contact spring 7 operate so as to return the drive electrodes 2 and 6 as well as the contact points 3 and 8 to their original states, multiple manufacturing processes are required in order to incorporate the return spring 5 and the contact spring 7 into a small switch. Consequently, this structure is expensive to make. Also, since the switch is mechanical, switching using high frequency is limited.

The present invention has been achieved in light of the above circumstances. The invention improves reliability and reduces cost. The present invention provides a method of manufacturing a high-frequency switch, which raises the speed of switching using high frequency, a high-frequency switch and an electronic apparatus.

SUMMARY

The method of manufacturing a high-frequency switch of the present invention comprises a step of forming a filter circuit by arranging a plurality of wiring patterns on a substrate and a step of forming an interference means that interferes with characteristics of the wiring patterns of the filter circuit without touching the wiring patterns.

Also, the method of manufacturing a high-frequency switch of the present invention comprises a step of forming the interference means so that the interference means freely moves above the wiring patterns of the filter circuit.

The method of manufacturing a high-frequency switch of the present invention further comprises a step of forming the interference means so that the interference means freely moves by rotating above the wiring patterns of the filter circuit.

Moreover, the method of manufacturing a high-frequency switch of the present invention further comprises a step of forming a plurality of the filter circuits on the substrate and a step of forming the interference means so that the interference means freely moves by rotating above the wiring patterns of a plurality of the filter circuits.

Also, the method of manufacturing a high-frequency switch of the present invention further comprises a step of forming a drive mechanism for driving the interference means on the substrate.

Furthermore, according to the method of manufacturing a high-frequency switch of the present invention, the interference means is formed of any one of a conductor and/or a dielectric substance.

In addition, according to the method of manufacturing a high-frequency switch of the present invention, the interference means is a rod-like member and has a thickness that varies depending on a portion thereof.

A high-frequency switch of the present invention comprises: a substrate; a filter circuit including a plurality of wiring patterns formed on the substrate; and an interference means that interferes with characteristics of the wiring patterns of the filter circuit formed on the substrate without touching the wiring patterns.

Also, in the high-frequency switch of the present invention, the interference means can freely move over the wiring patterns of the filter circuit.

Moreover, in the high-frequency switch of the present invention, the interference means can freely move by rotating over the wiring patterns of the filter circuit.

In addition, in the high-frequency switch of the present invention, a plurality of the filter circuits are formed on the substrate, and the interference means can freely move by rotating over the wiring patterns of a plurality of the filter circuits.

Furthermore, the high-frequency switch of the present invention, a drive mechanism for driving the interference means is formed on the substrate.

Also, in the high-frequency switch of the present invention, the interference means is any one of a conductor and/or a dielectric substance.

Moreover, in the high-frequency switch of the present invention, the interference means is a rod-like member and has a thickness that varies depending on a portion thereof.

An electronic apparatus of the present invention includes the high-frequency switch according to the above.

According to the method of manufacturing a high-frequency switch and in a high-frequency switch and an electronic apparatus of the present invention, a filter circuit is formed by arranging a plurality of wiring patterns on a substrate, and an interference means is formed to interfere with characteristics of the wiring patterns of the filter circuit without touching the wiring patterns.

DETAILED DESCRIPTION

The embodiments of the present invention are explained below.

FIG. 1 through FIG. 6 illustrate the principle of a high-frequency switch of the present invention. FIG. 7 through FIG. 16 illustrate particular examples of the high-frequency switch shown in FIG. 1.

Figure 1:
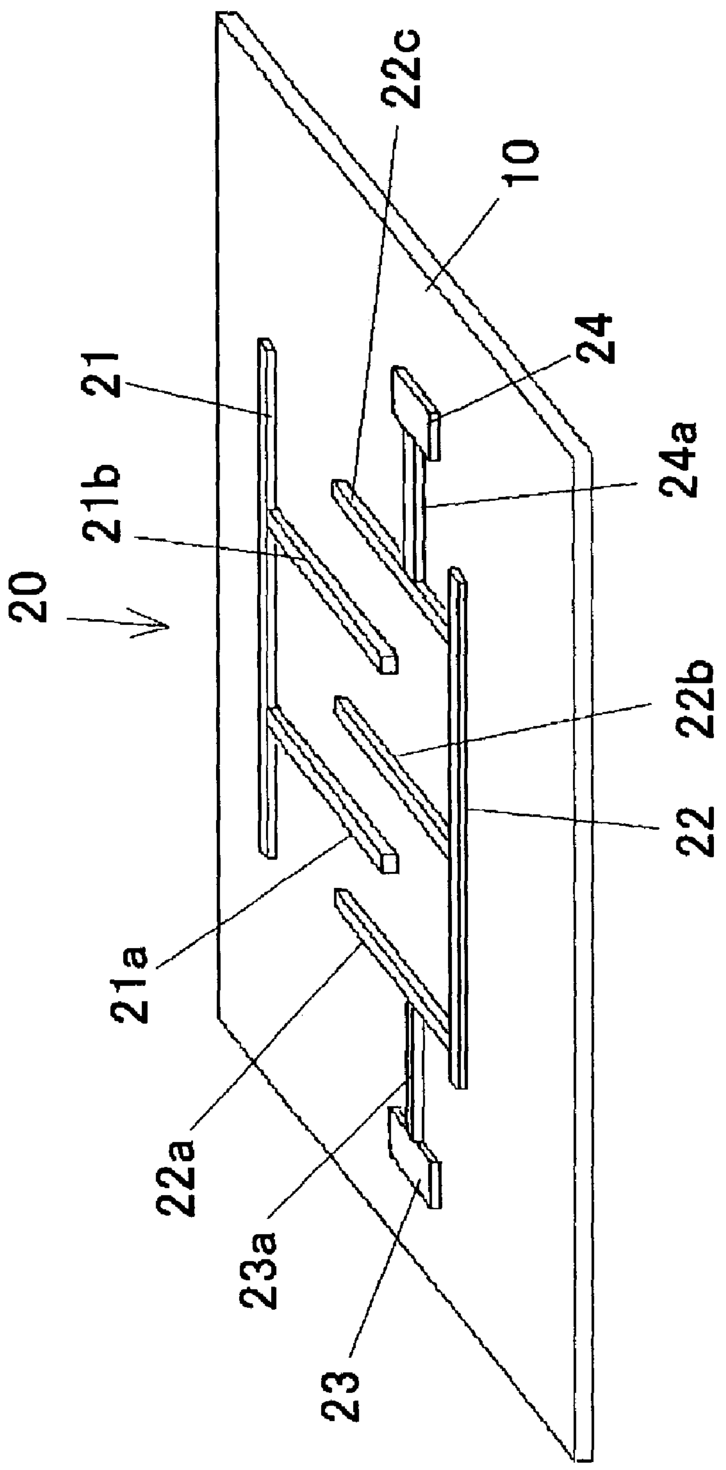
FIG. 1 illustrates a principle of a high-frequency switch of the present invention.

FIG. 1 shows the high-frequency switch of the present invention. The high-frequency switch comprises a Band Pass Filter (BPF) 20 which is a wavelength resonance type filter including a wiring pattern like the teeth of a comb on a substrate 10. The substrate 10 may be formed of, for example, glass epoxy, ceramic, glass or silicone.

Figure 2:
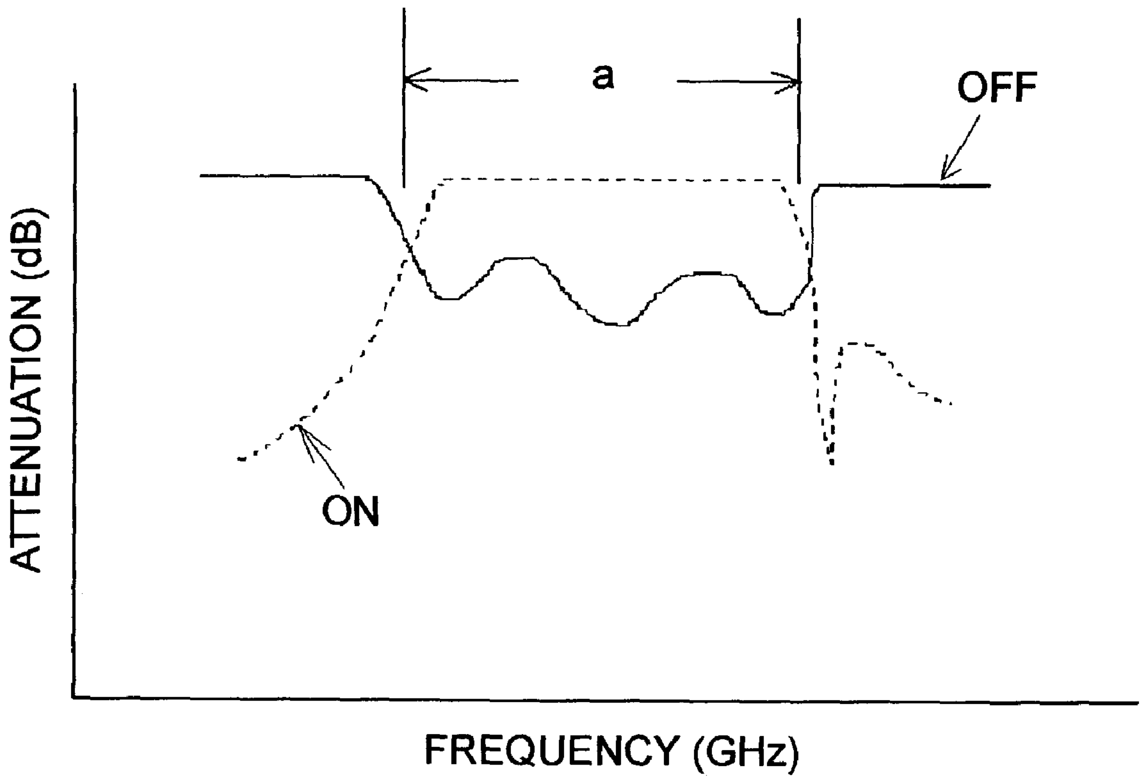
FIG. 2 illustrates the principle of the high-frequency switch of the present invention.

The wiring pattern of the BPF 20 may be formed of, for example, Cu, Au or ITO. The BPF 20 comprises wirings 21*a* and 21*b* extending parallel to each other from a GND electrode 21 and also wirings 22*a* to 22*c* extending parallel to each other from a GND electrode 22. The wirings 21*a* and 21*b* are placed in parallel to the wirings 22*a* to 22*c* and located in spaces between the wirings 22*a* to 22*c*, respectively. The wirings 22*a* and 22*c* are connected to electrodes 23 and 24 through wirings 23*a* and 24*a*, respectively. The BPF 20 exhibits a feature of passing a frequency within a range of "a" when the voltage between the electrodes 23 and 24 is in an on-state, as shown in FIG. 2.

Figure 3:
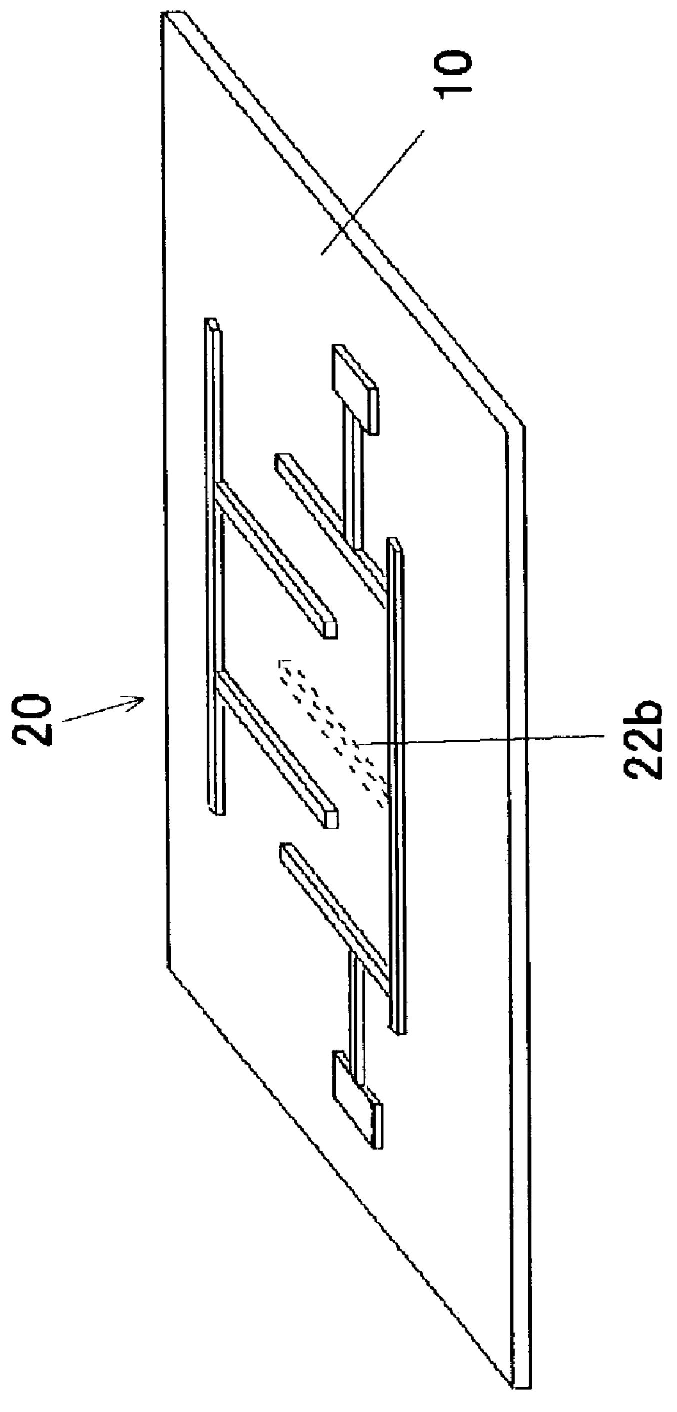
FIG. 3 illustrates the principle of the high-frequency switch of the present invention.
Figure 4:
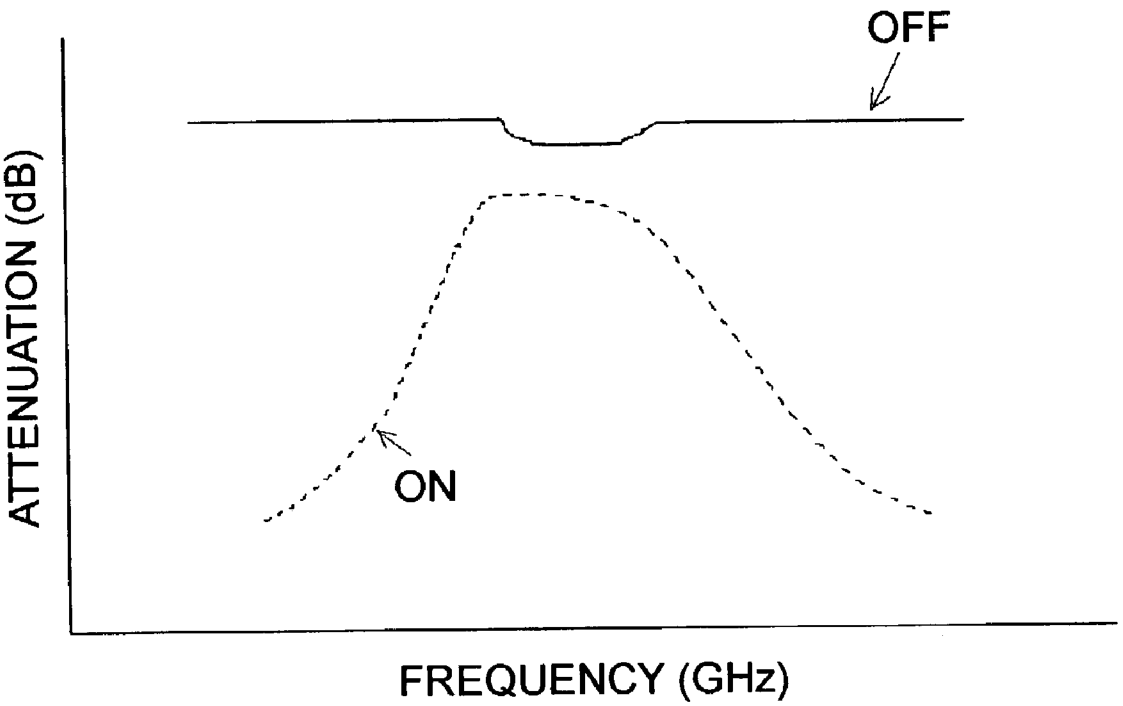
FIG. 4 illustrates the principle of the high-frequency switch of the present invention.

FIG. 3 shows a BPF 20 in which the wiring 22*b* is omitted from the BPF 20 of FIG. 1. When the wiring 22*b* is omitted as shown in FIG. 3, the BPF 20 has a characteristic in that passage of the frequency in the range of "a" is cut while the voltage between the electrodes 23 and 24 is in an on-state.

Figure 5:
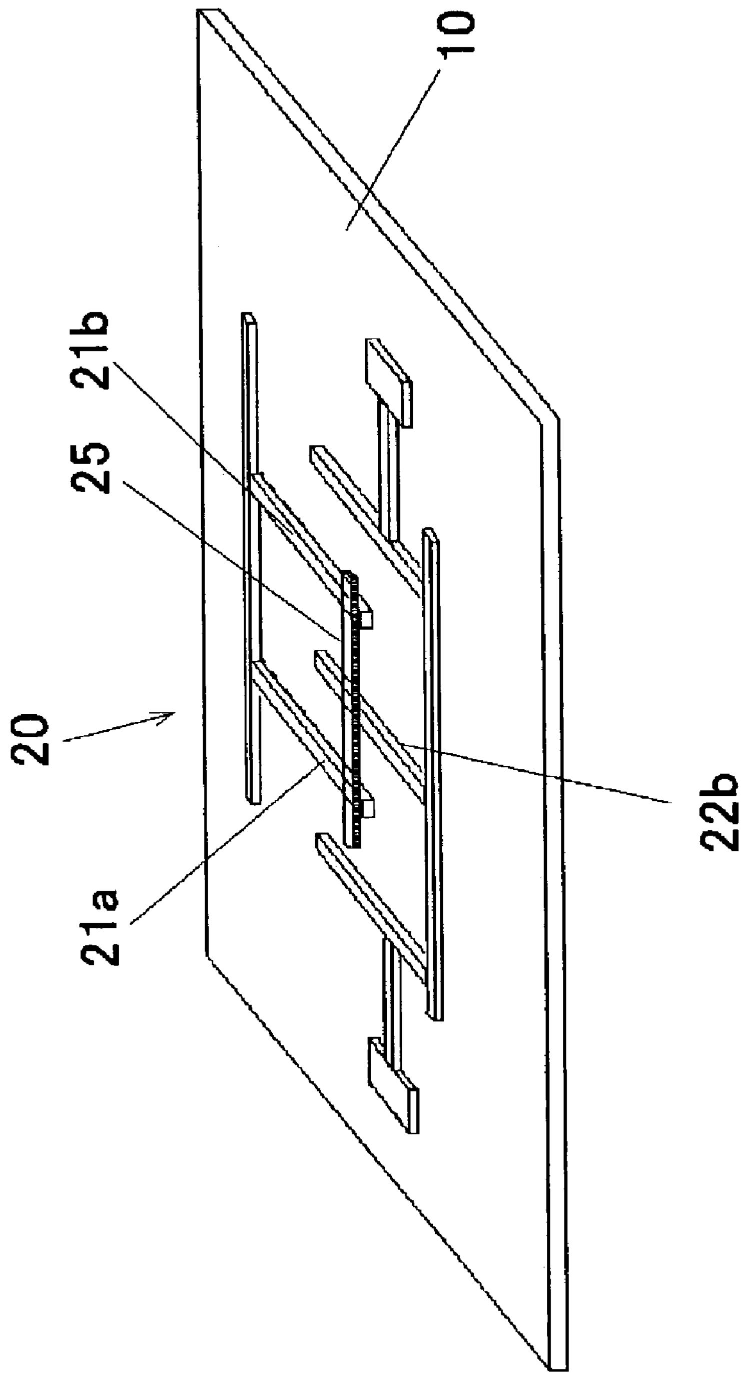
FIG. 5 illustrates the principle of the high-frequency switch of the present invention.
Figure 6:
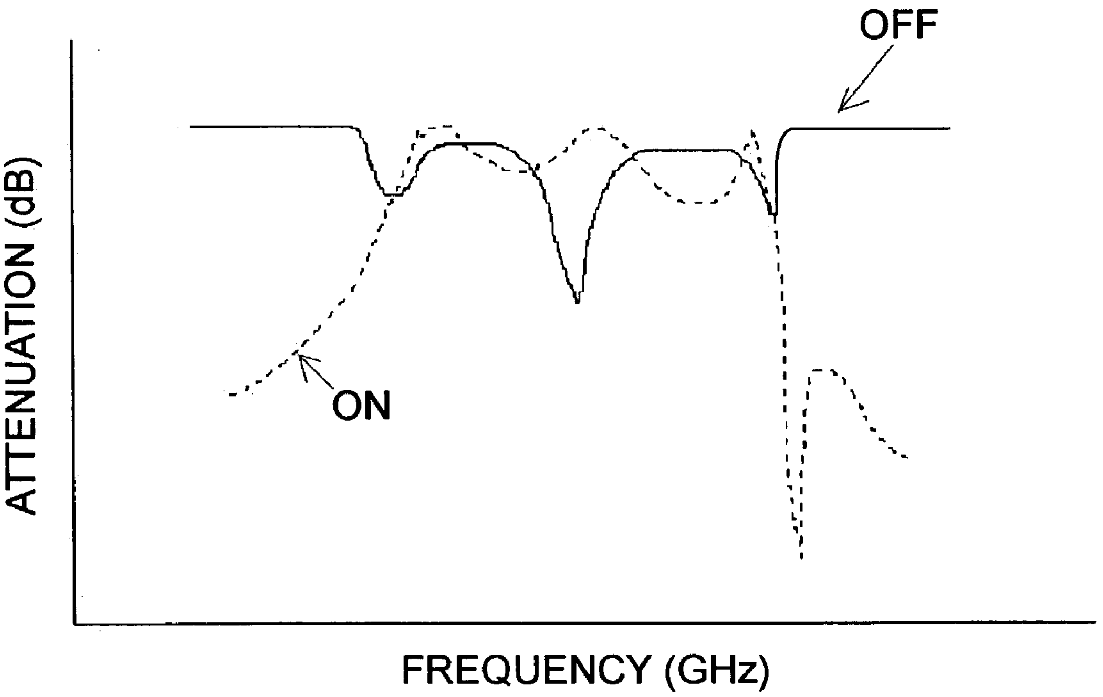
FIG. 6 illustrates the principle of the high-frequency drawing of the present invention.

Also, when a wiring 25 is added so as to short-cut the wirings 21*a*, 21*b*, and 22*b* of the BPF 20 as shown in FIG. 5, the BPF has a characteristic in that passage of the frequency in the range of "a" is cut while the voltage between the electrodes 23 and 24 is in an on-state as shown in FIG. 6.

As mentioned above, passage of the frequency can be cut by giving interfering with the wirings 21*a* and 21*b* as well as with 22*a* to 22*c* of the BPF 20. Consequently, it is possible to switch based on this property.

Next, particular examples of interfering with the wirings 21*a* and 21*b* as well as with the wirings 22*a* to 22*c* of the BPF 20 are explained.

Figure 7:
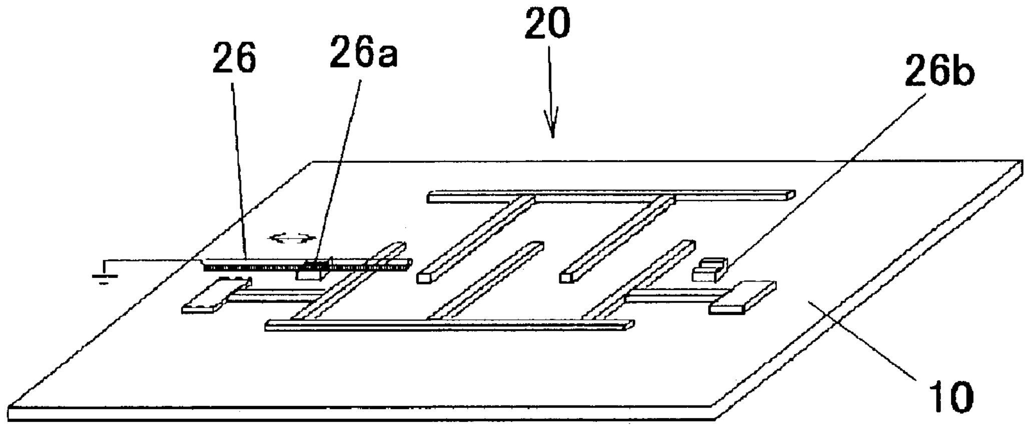
FIGS. 7A and 7B illustrate a particular example of the high-frequency switch shown in FIG. 1.
Figure 7:
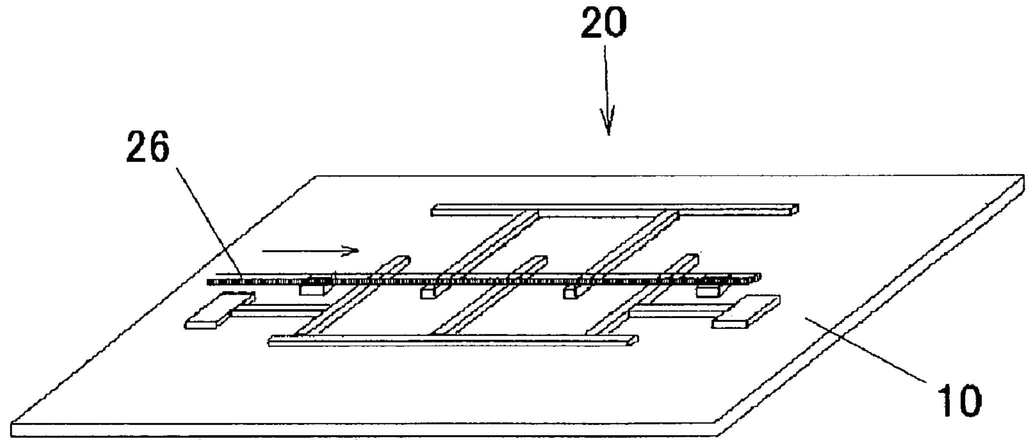

FIG. 7 shows a case of employing an impedance control rod 26 as an interference means. The impedance control rod 26 may be formed of an electric conductor or a dielectric material. The impedance control rod 26 can freely move in a direction orthogonal to the wirings 21*a* and 21*b* as well as to the wirings 22*a* to 22*c* of the BPF 20 without touching them along guide portions 26*a* and 26*b* provided on the substrate 10.

In such a structure, the impedance control rod 26 is located so as not to interfere with the wirings 21*a* and 21*b* as well as the wirings 22*a* to 22*c* as shown in FIG. 7(*a*) when not cutting the passage of the frequency in the BPF 20. On the other hand, when cutting the passage of the frequency in the BPF 20, the impedance control rod 26 is pushed out in the direction orthogonal to the wirings 21*a* and 21*b* as well as to the wirings 22*a* to 22*c* of the BPF 20 along the guide portions 26*a* and 26*b* and interferes with the wirings 21*a* and 21*b* as well as the wirings 22*a* to 22*c* without touching them as shown in FIG. 7(*b*).

As described above, it is possible to pass and cut the frequency by moving the impedance control rod 26 along the guide portions 26*a* and 26*b* in the direction orthogonal to the wirings 21*a* and 21*b* as well as to the wirings 22*a* to 22*c* of the BPF 20. Consequently, switching is enabled by passing and cutting the frequency.

Figure 8:
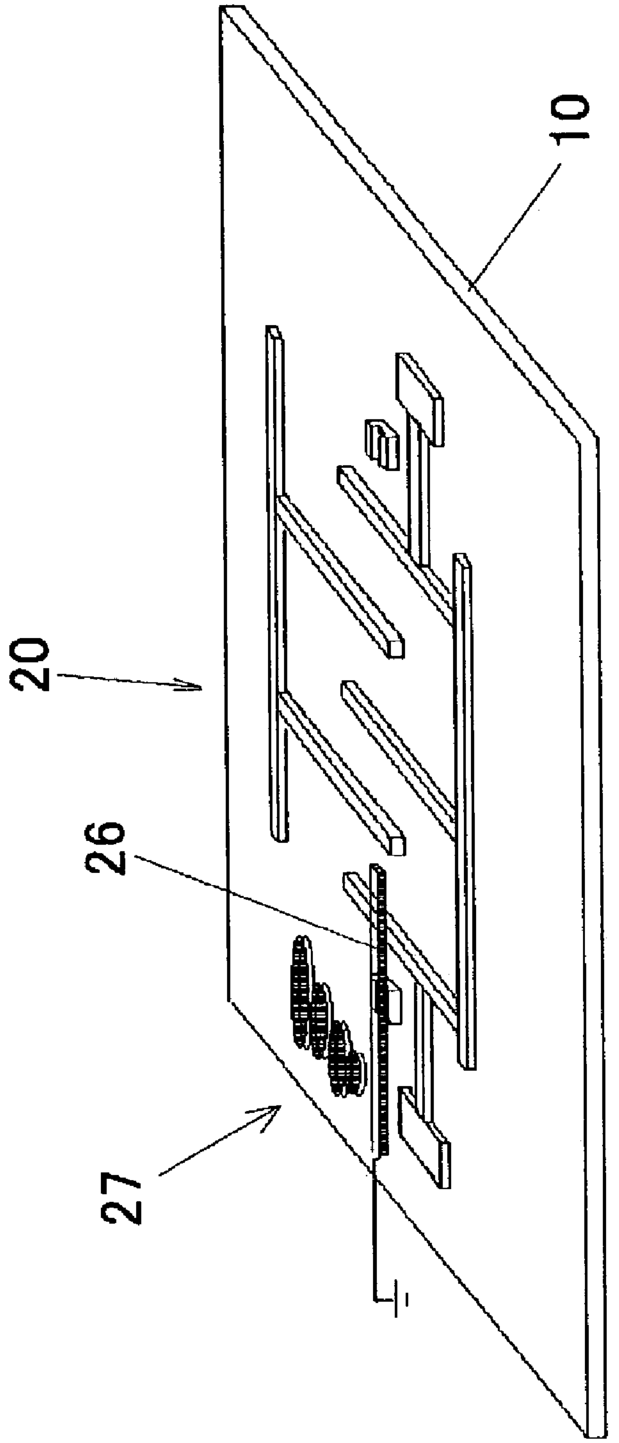
FIG. 8 illustrates a particular example of the high-frequency switch shown in FIG. 1.

A gear mechanism 27 shown in FIG. 8 may be employed as a drive mechanism for transmitting the driving force of a motor (not shown in the drawing), serving as a drive source for moving the impedance control rod 26.

Figure 9:
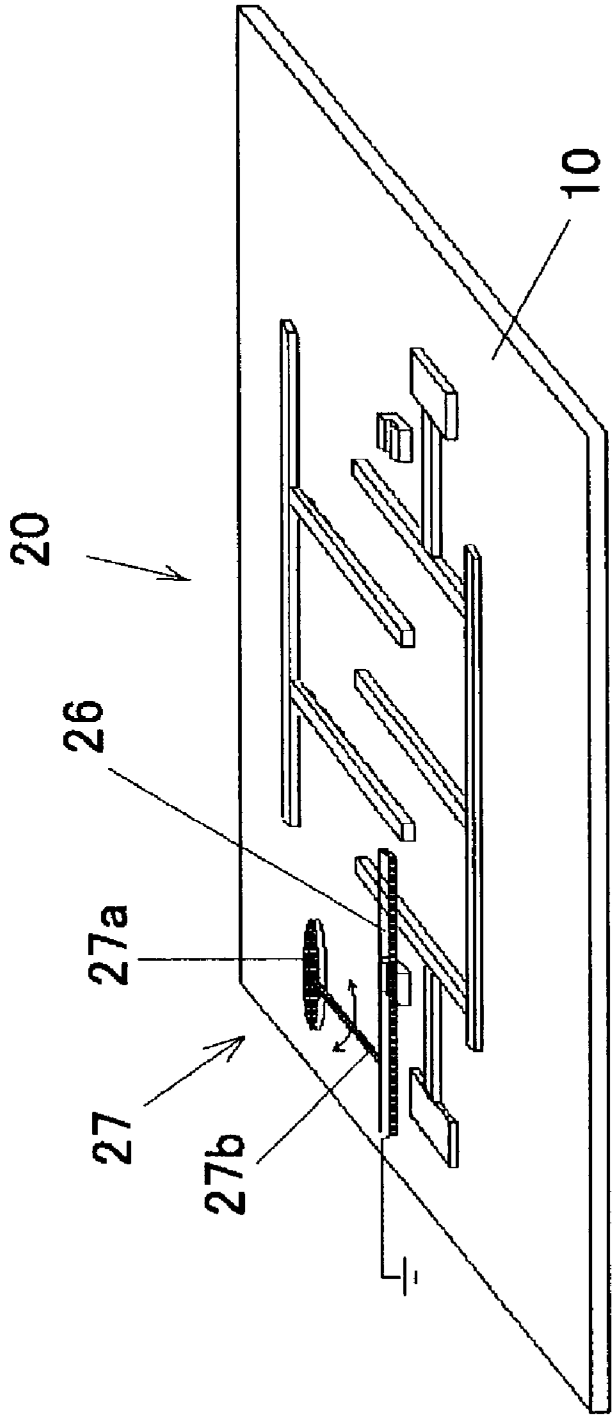
FIG. 9 illustrates a particular example of the high-frequency switch shown in FIG. 1.

Also, it is possible to freely move the impedance control rod 26 by using rotation of a connecting rod 27*b* provided on a gear 27*a* of the gear mechanism 27 as shown in FIG. 9.

As described above, this BPF is a hybird design since it incorporates the gear mechanism 27 on the substrate 10 but is a compact structure.

Figure 10:
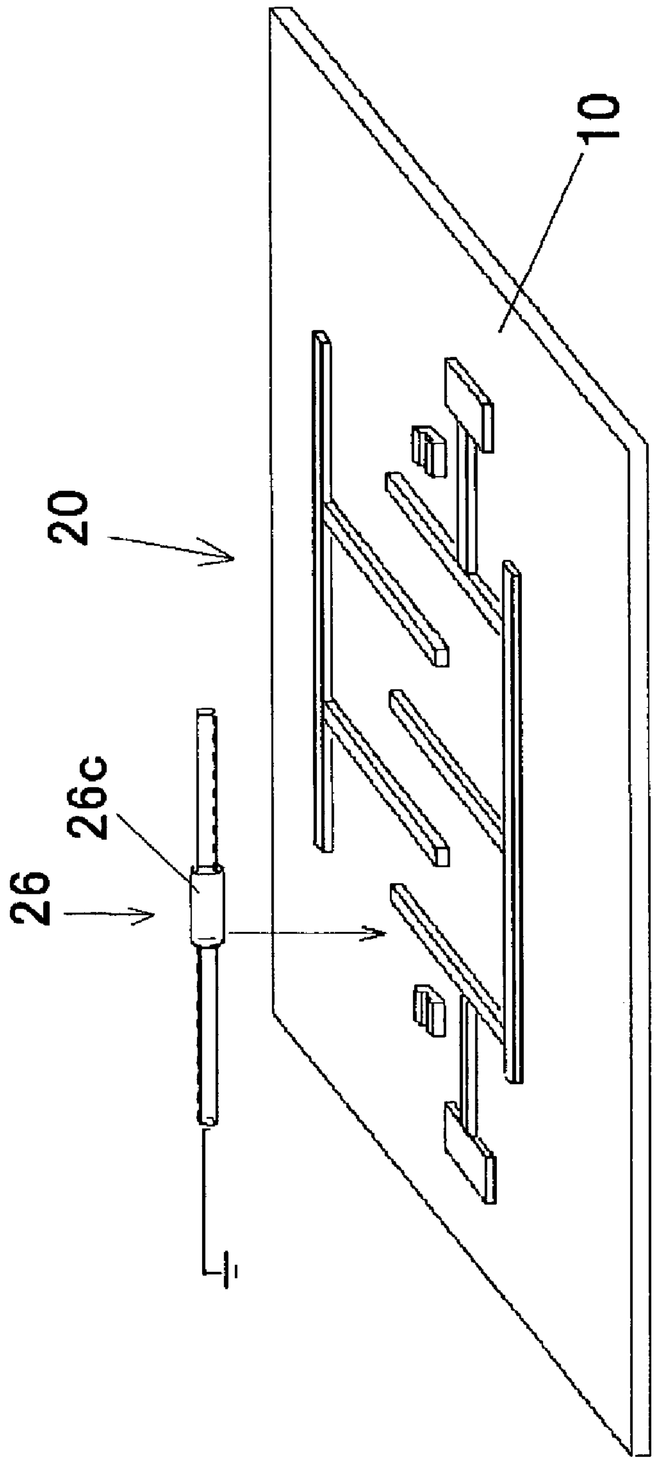
FIG. 10 illustrates a particular example of the high-frequency switch shown in FIG. 1.
Figure 11:
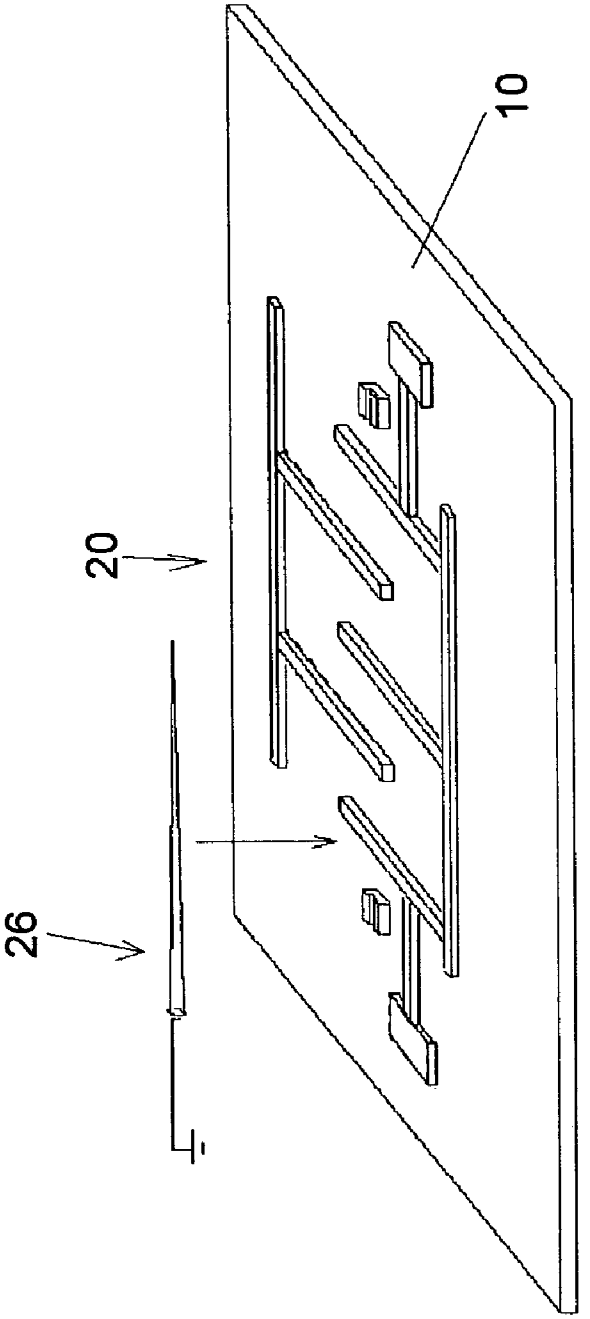
FIG. 11 illustrates a particular example of the high-frequency switch shown in FIG. 1.

Moreover, the impedance control rod 26 may include a large-diameter portion 26*c* at the center thereof as shown in FIG. 10. In this case, it is possible to vary the degree of changes in impedance. Also, the impedance control rod 26 may be conically shaped as shown in FIG. 11. In this case as well, it is possible to vary the degree of changes in impedance.

Figure 12:
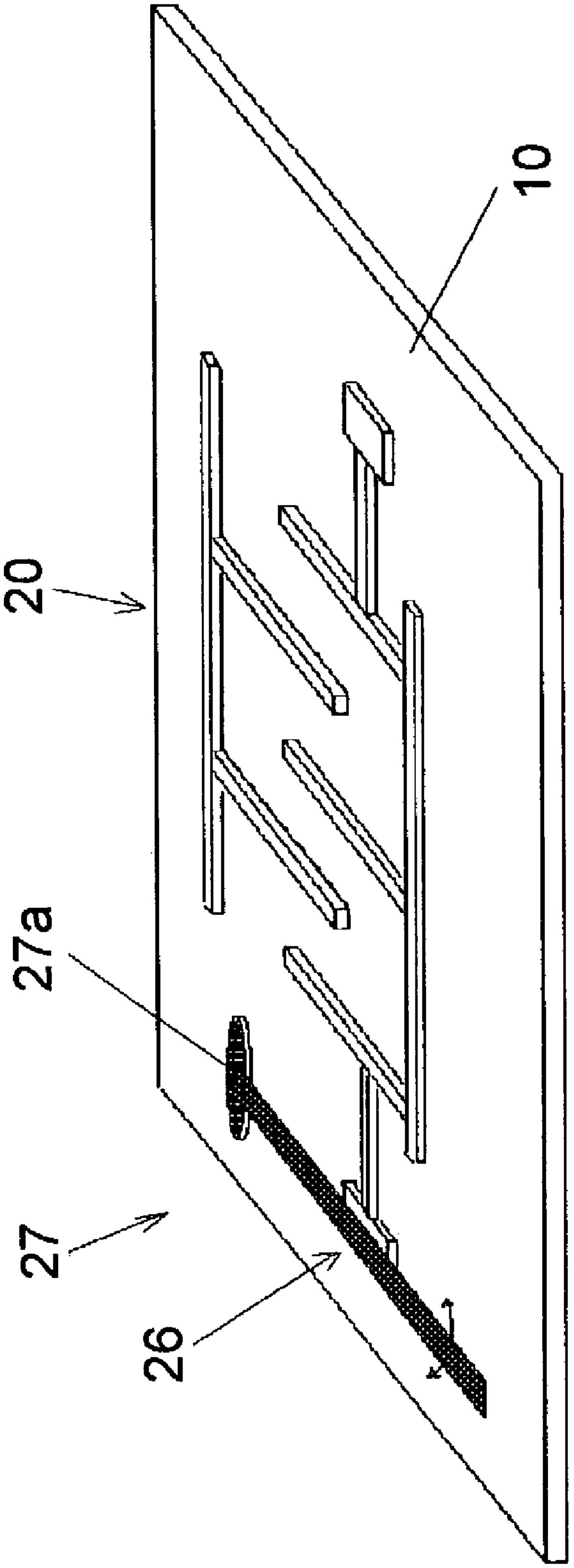
FIG. 12 illustrates a particular example of the high-frequency switch shown in FIG. 1.

Also, the impedance control rod 26 may be coupled to the gear 27*a* of the gear mechanism 27 so as to be rotatable as shown in FIG. 12. In this case, the guide portions 26*a* and 26*b* are unnecessary, thereby simplifying the structure. Therefore, cost can be further reduced.

Figure 13:
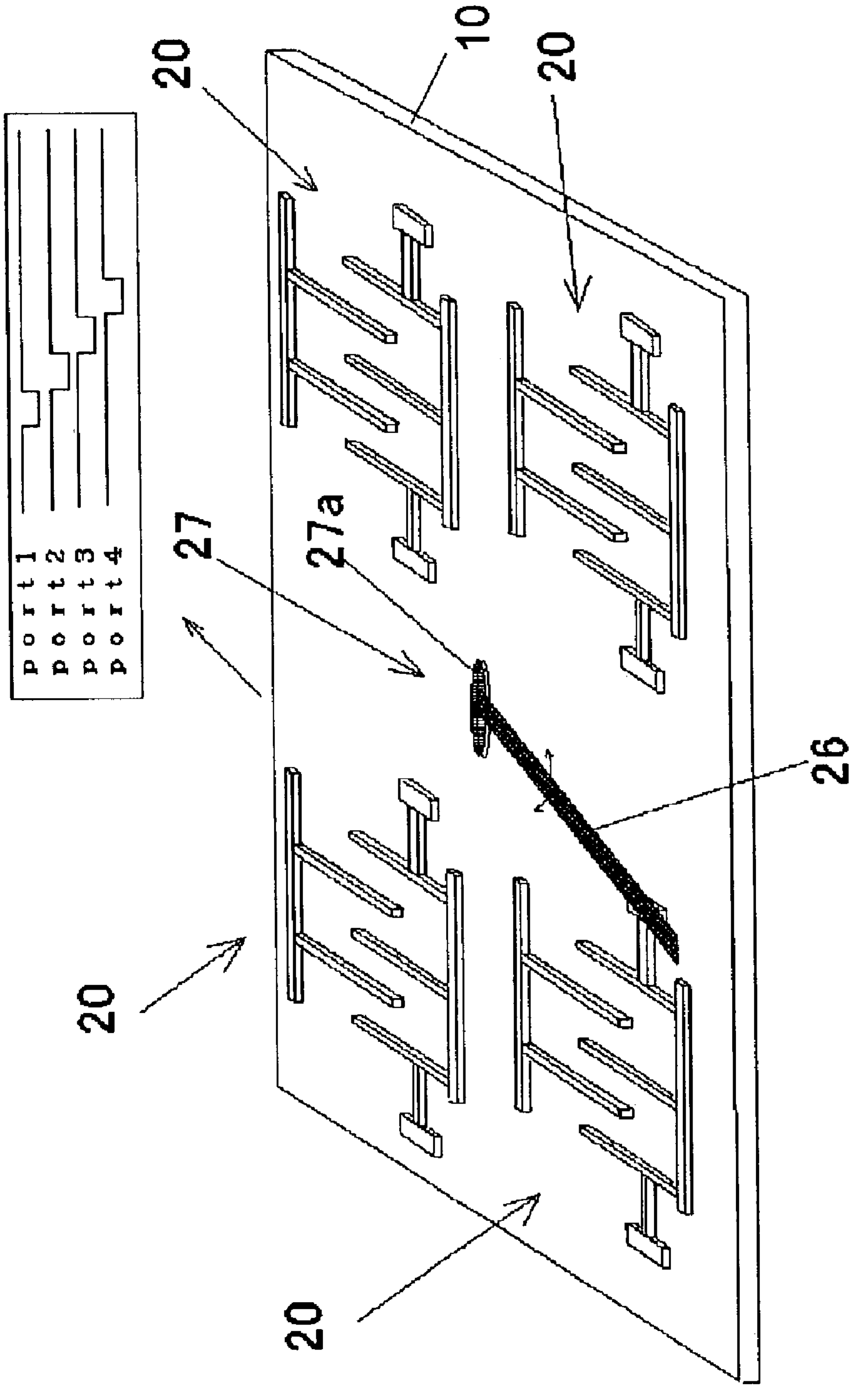
FIG. 13 illustrates a particular example of the high-frequency switch shown in FIG. 1.
Figure 14:
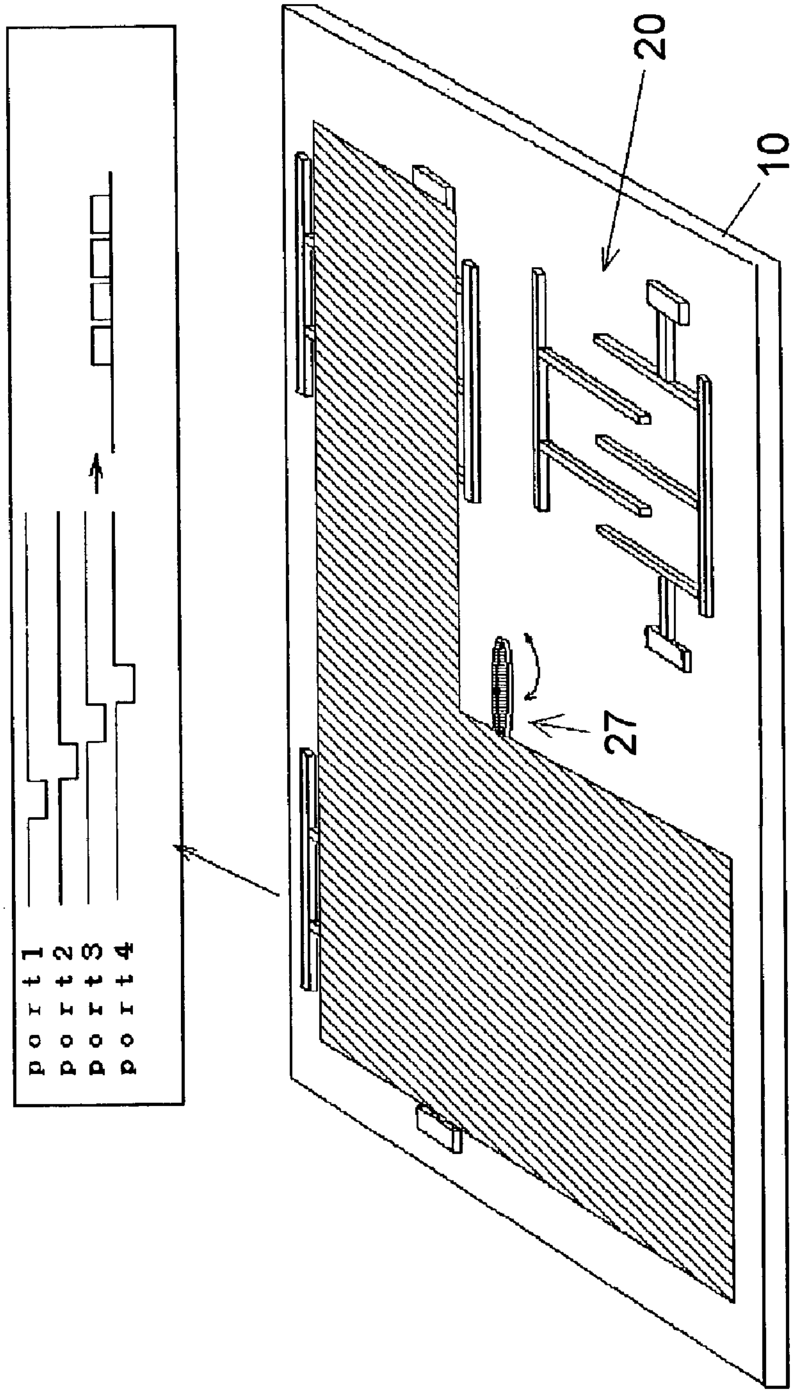
FIG. 14 illustrates a particular example of the high-frequency switch shown in FIG. 1.

Moreover, the substrate 10 may be provided with, for example, four BPF's 20 thereon as shown in FIG. 13. In this case, it is possible to provide the gear mechanism 27 at the center of the substrate 10 and to rotate the impedance control rod 26 connected to the gear 27*a* of the gear mechanism 27. In this way, the impedance control rod 26 rotates above a plurality of BPF's 20 without touching them, so that it is possible to obtain data corresponding to the rotational frequency of the impedance control rod 26. Also, the data corresponding to the rotational frequency can be multiplexed by enabling one BPF 20 to output data of the BPF's 20 in the dashed area as shown in FIG. 14.

Figure 15:
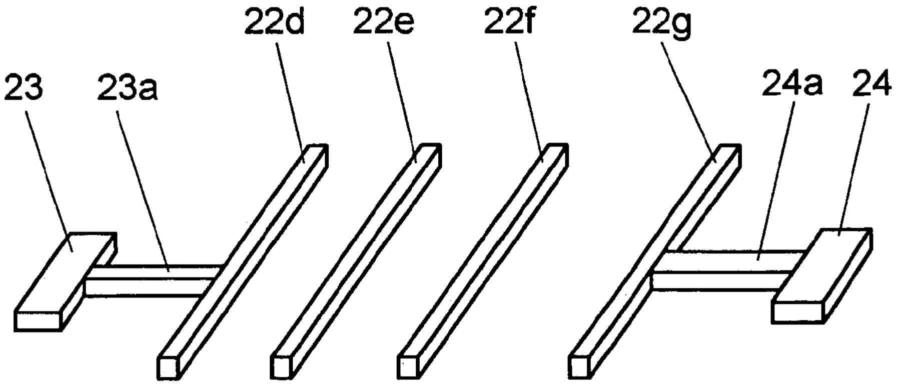
FIG. 15 illustrates a particular example of the high-frequency switch shown in FIG. 1.
Figure 16:
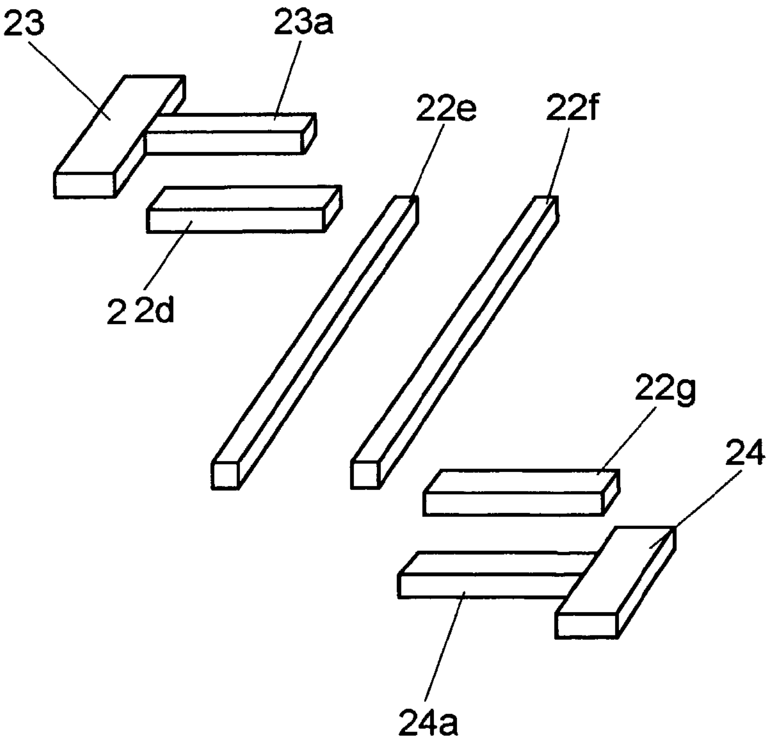
FIG. 16 illustrates a particular example of the high-frequency switch shown in FIG. 1.
Figure 17A:
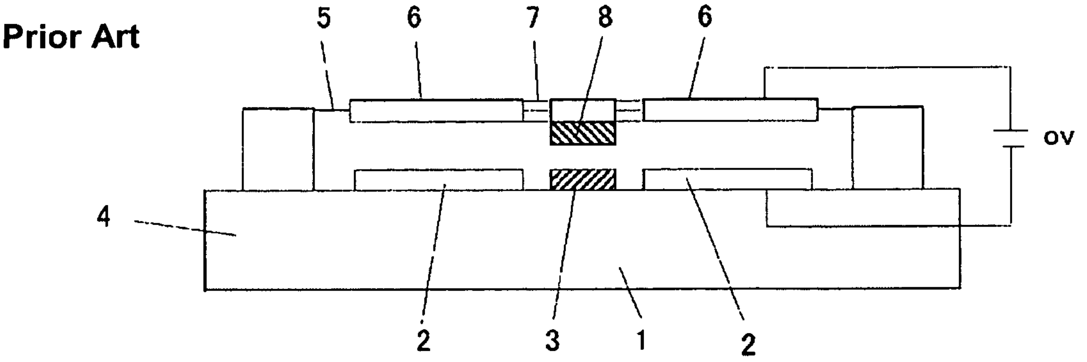
Fig. 17(a) Prior Art
FIGS. 17A–17C illustrate an example of a conventional high-frequency switch.
Figure 17B:
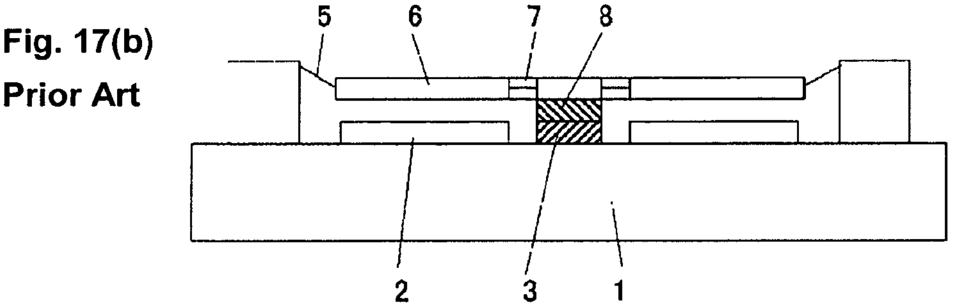
Fig. 17(b) Prior Art
Figure 17C:
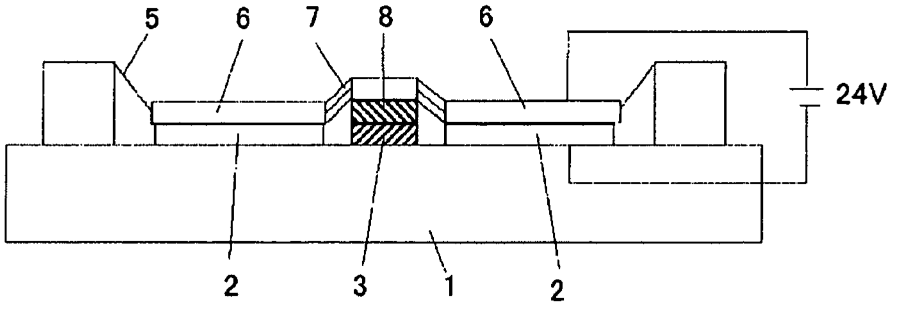
Fig. 17(c) Prior Art

Here, the shape of the BPF 20 is not limited to the teeth of a comb, and wirings 22*d* to 22*g* may be arranged parallel to each other as illustrated in FIG. 15, for example. Also, the wirings 22*d* and 22*g* may be parallel to each other, and the wirings 22*e* and 22*f* may also be parallel to each other as shown in FIG. 16. Then, the wirings 22*d* and 22*g* may be orthogonal to the wirings 22*e* and 22*f*.

In this way, the BPF 20 as a filter circuit is formed by arranging the plurality of wirings 21*a*, 21*b*, and 22*a* to 22*c* on the substrate 10 in the present embodiment. At the same time, the present embodiment comprises the freely movable impedance control 26 that interferes with the characteristics of the wirings 21*a*, 21*b* and 22*a* to 22*c* of the BPF 20 without touching them.

Consequently, since the impedance control rod 26 and the wirings 21*a*, 21*b* and 22*a* to 22*c* of the BPF 20 are not in contact, degradation does not occur, and reliability can be improved.

Moreover, since a mechanical structure using the operation of a spring is unnecessary unlike the prior art, the structure can be extremely simplified, and the cost can be reduced. Since the impedance control rod 26 can interfere with the wirings 21*a*, 21*b* and 22*a* to 22*c* of the BPF 20 using high frequency, it is possible to raise the speed of switching using high frequency.

In addition, the high-frequency switch of the present embodiment is not limited to switching but is also applicable to a variable filter, variable capacitor and variable inductor.

Furthermore, it is possible to enhance the quality of an electronic apparatus by installing the high-frequency switch of the present embodiment in an electronic apparatus such as a cellular phone and an optical communication apparatus.

Advantage of the Invention

As described above, according to the method of manufacturing the high-frequency switch of the present invention, and in the high-frequency switch and the electronic apparatus, the filter circuit is formed by arranging a plurality of wiring patterns on the substrate, and the interference means is formed so as to interfere with the characteristics of the wiring patterns on the filter circuit without touching them. Therefore, it is possible to enhance reliability and reduce cost as well as to raise the speed of switching using high frequency.

The entire disclosure of Japanese Patent Application No. 2002-145156 filed May 20, 2002 is incorporated by reference.

What is claimed is:

1. A method of manufacturing a high-frequency switch comprising:

a step of forming a filter circuit by arranging a plurality of wiring patterns on a first surface of a substrate; and a step of forming an interference member that interferes with the wiring patterns of the filter circuit without touching the wiring patterns, the interference member disposed within a plane generally parallel to the first surface;

wherein the interference member is freely rotatable relative to the substrate within the plane.

2. The method of manufacturing a high-frequency switch according to claim 1, further comprising:

a step of forming a plurality of the filter circuits on the substrate; and a step of forming the interference member so that the interference member freely moves by rotating above the wiring patterns of a plurality of the filter circuits.

3. The method of manufacturing a high-frequency switch according to claim 1, further comprising a step of forming a drive mechanism for driving the interference member on the substrate.

4. The method of manufacturing a high-frequency switch according to claim 1, wherein the interference member is formed of at least one of a conductor and a dielectric substance.

5. The method of manufacturing a high-frequency switch according to claim 1, wherein the interference member is a rod-like member having various thicknesses.

6. A high-frequency switch comprising:

a substrate having a first surface;

a filter circuit including a plurality of wiring patterns formed on the first surface of the substrate; and an interference member that interferes with the wiring patterns of the filter circuit formed on the substrate without touching the wiring patterns, the interference member disposed within a plane generally parallel to the first surface;

wherein the interference member is freely rotatable relative to the substrate within the plane.

7. The high-frequency switch according to claim 6, further comprising means for freely moving the interference member over the wiring patterns of the filter circuit.

8. The high-frequency switch according to claim 6, further comprising a drive mechanism for driving the interference member on the substrate.

9. The high-frequency switch according to claim 6, wherein the interference member is at least one of a conductor and a dielectric substance.

10. The high-frequency switch according to claim 6, wherein the interference member is a rod-like member having various thicknesses.

* * * * *